United States Patent
Howard et al.

(10) Patent No.: US 8,531,030 B2
(45) Date of Patent: Sep. 10, 2013

(54) IC DEVICE HAVING ELECTROMIGRATION RESISTANT FEED LINE STRUCTURES

(75) Inventors: Gregory Eric Howard, Plano, TX (US); Patrick Thompson, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 277 days.

(21) Appl. No.: 12/970,464

(22) Filed: Dec. 16, 2010

(65) Prior Publication Data
US 2012/0153458 A1 Jun. 21, 2012

(51) Int. Cl.
*H01L 23/48* (2006.01)

(52) U.S. Cl.
USPC ............. 257/737; 257/E23.032; 257/E23.035

(58) Field of Classification Search
USPC .................. 438/106–109, 612–617; 257/686, 257/690, 737, 738, 745, 777–786, E23.032, 257/E23.033, E23.035
See application file for complete search history.

(56) References Cited

U.S. PATENT DOCUMENTS

| | | |
|---|---|---|
| 2005/0028123 A1 | 2/2005 | Pekin et al. |
| 2008/0042271 A1 | 2/2008 | Dauksher et al. |
| 2010/0032835 A1 | 2/2010 | Daubenspeck et al. |
| 2010/0123215 A1* | 5/2010 | Pan et al. ............... 257/532 |

* cited by examiner

*Primary Examiner* — Brook Kebede
(74) *Attorney, Agent, or Firm* — Steven A. Shaw; W. James Brady; Frederick J. Telecky, Jr.

(57) ABSTRACT

An integrated circuit (IC) device includes an electromigration resistant feed line. The IC device includes a substrate including active circuitry. A back end of the line (BEOL) metallization stack includes an interconnect metal layer that is coupled to a bond pad by the EM resistant feed line. A bonding feature is on the bond pad. The feed line includes a uniform portion and patterned trace portion that extends to the bond pad which includes at least three sub-traces that are electrically in parallel. The sub-traces are sized so that a number of squares associated with each of the sub-traces are within a range of a mean number of squares for the sub-traces plus or minus twenty percent or a current density provided to the bonding feature through each sub-trace is within a range of a mean current density provided to the bonding feature plus or minus twenty percent.

18 Claims, 8 Drawing Sheets

IC DEVICE HAVING ELECTROMIGRATION RESISTANT FEED LINE STRUCTURES

FIELD

Disclosed embodiments relate to integrated circuit (IC) devices that include feed line structures that improve electromigration (EM) performance.

BACKGROUND

ICs generally comprise a substrate, active circuitry formed on the topside of the substrate, and a back end of the line (BEOL) structure including alternating metal wiring layers and interlevel dielectric layers (ILD) above the active circuitry. The metal wiring layers comprise various interconnects that provide electrical connections between the active circuitry and external connections. Solder bumps (or solder balls) are commonly utilized to provide a connection between the last (e.g., top) metal wiring level of a semiconductor device and another device, such as from a node in the active circuitry or situations where interconnect plays a passive role where the solder bump/is simply part of a pass-through (e.g., for a stacked die/package). A common type of solder bump is the controlled collapse chip connection (C4) solder bump, often used for jointing for flip chip devices.

As dimensions of features (e.g., pads, wires, interconnects, vias) shrink to create smaller devices, the maximum allowable current density decreases rapidly due to EM-based constraints imposed for reliability. EM is a known phenomenon in which atoms of a metal feature are displaced due to the electrical current passing through the metal feature.

IC devices such as flip chip devices are requiring higher and higher current carrying capabilities, sometimes to the level of 10 amps or more. Solder is known to have a significantly lower current density handling ability as compared to conventional metal interconnects, such as copper and aluminum. For example, solder has a relatively low EM current limit (e.g., typical EM-limited current density for conventional solder is around $10^4$ A/cm$^2$, about one hundred times lower than that of copper and aluminum). The current carrying capability of each flip chip solder bump sets the minimum number of solder bumps used to supply this current to limit the current density through the solder bumps due to EM constraints. The conventional flip chip solder bump process suffers from a current distribution non-uniformity over the cross sectional area of the solder bump which accelerates the EM-based degradation of the solder and causes failures earlier than for the case where the current distribution is more uniform.

One example of a conventional flip chip bump arrangement includes a copper feed line to an aluminum bond pad formed from a top metal layer, a dielectric (e.g., polyimide) layer including an opening (dielectric opening) over the pad, a thick (e.g., 2 μm thick) nickel under bump metallization (UBM) layer over the dielectric layer and the dielectric opening, and a solder bump over the UBM. This arrangement suffers from significant current non-uniformity across the cross sectional area of the solder bump.

For a solder bump with a feed line current coming from one side, the peak current in the solder bump area adjacent to the UBM may exist over a portion of the cross sectional area that is only about 10% of the overall cross sectional area of the solder bump. This is the current crowded region in the solder bump that voids first due to exceeding the EM current density limit of solder. Once this region voids, the solder area next to it will carry the peak current distribution and will void next. This voiding pattern will continue until the whole solder bump over the dielectric opening becomes voided. At this time the outer annulus of the UBM over the dielectric will begin the void, and eventually an open circuit will result.

One known solution to this problem involves adding a thick copper stud in the UBM which helps spread current across the cross sectional area of the solder bump. This known solution adds a process step and is only minimally effective since it cannot render uniform current density for typical stud dimensions. There is thus a need for new feed line to bonding feature arrangements that allow the current to be more uniform over the cross sectional area of the solder bump or other bonding feature without adding a process step or significantly increasing the area required to implement the feed line structure.

SUMMARY

Disclosed embodiments describe integrated circuit (IC) devices that have electromigration (EM) resistant feed line structures to the bonding features that force the current flowing into the bonding feature to be more uniform across its cross sectional area. Such current spreading embodiments solve or at least significantly reduce EM-induced voiding in bonding features, such as solder bumps.

By dividing the feed line trace to the bonding feature into at least three electrically parallel sub-trace paths, with the respective sub-trace paths having at least one of (i) appropriate line sizings to make the plurality of feed currents substantially equal currents (i.e., longer lines are wider, and shorter lines are narrower) and ii) a current density provided to the bonding feature conducted through each of the sub-traces being substantially equal, higher total current levels can be handled by the bonding feature without EM-based problems due to better distribution of current (less current crowding) across the cross sectional area of the bonding feature. Disclosed embodiments do not generally add any process steps.

For example, disclosed feed structures can replace a conventional single incoming feed line trace (e.g., a 10 micron wide trace from end to end) by a trace that includes a patterned trace portion comprising a plurality of sub-traces (e.g., eight, twelve, sixteen or even more sub-traces). In one embodiment, the current density provided to the bonding feature conducted through each of the sub-traces is substantially equal. As used herein, "substantially equal current density" provided to the bonding feature conducted through each of the sub-traces refers to the current densities each being within a range of the mean current density provided to the bonding feature plus or minus twenty percent.

In another embodiment, the sub-traces have different widths and different lengths, where the respective sub-traces each have a substantially equal numbers of squares. As used herein, a "substantially equal number of squares" produces substantially equal sub-trace currents and refers to a number of squares associated with the paths provided by each of the sub-traces all being within a range of a mean number of squares for the sub-traces plus or minus twenty percent, and in one embodiment is within a range of a mean number of squares for the sub-traces plus or minus ten percent.

In an embodiment referred to herein as the edge feed embodiment, the sub-traces can be distributed so that the area under the edge (perimeter) of the bonding feature over a dielectric opening has an equal distribution of feed line sub-trace contacts, that is the separation (spacing) between each feed line sub-trace to its neighbors under the bond pad is substantially uniform. In this embodiment "substantially equal separation" refers to the distances along the perimeter between the sub-traces all being within a range of a mean perimeter spacing distance for the plurality of sub-traces plus or minus twenty percent. Since the number of squares and thus the resistance of each feed line sub-trace can be substantially equal in this embodiment, the current in the uniform trace portion will divide itself substantially equally amongst each of the sub-trace paths to the bonding feature available to it. Thus, for the edge feed embodiment the periphery under the bonding feature will see a uniform current into it and a more uniform current distribution in the bonding feature (e.g., solder bump) is generally achieved.

In an embodiment referred to herein as the area feed embodiment, substantially the full area of the bonding feature is fed by current. In this embodiment, the bond pad has vias distributed over the substantially the full area under or over the bond pad. In this embodiment, a via pattern can be provided in the dielectric layer over bond pad (e.g., between the bond pad and a UBM pad), or the via pattern can be in the dielectric under bond pad (e.g., between the feed line sub-traces and the bond pad). The area feed embodiment may also be combined with the edge feed embodiment.

DETAILED DESCRIPTION

Figure 1A:
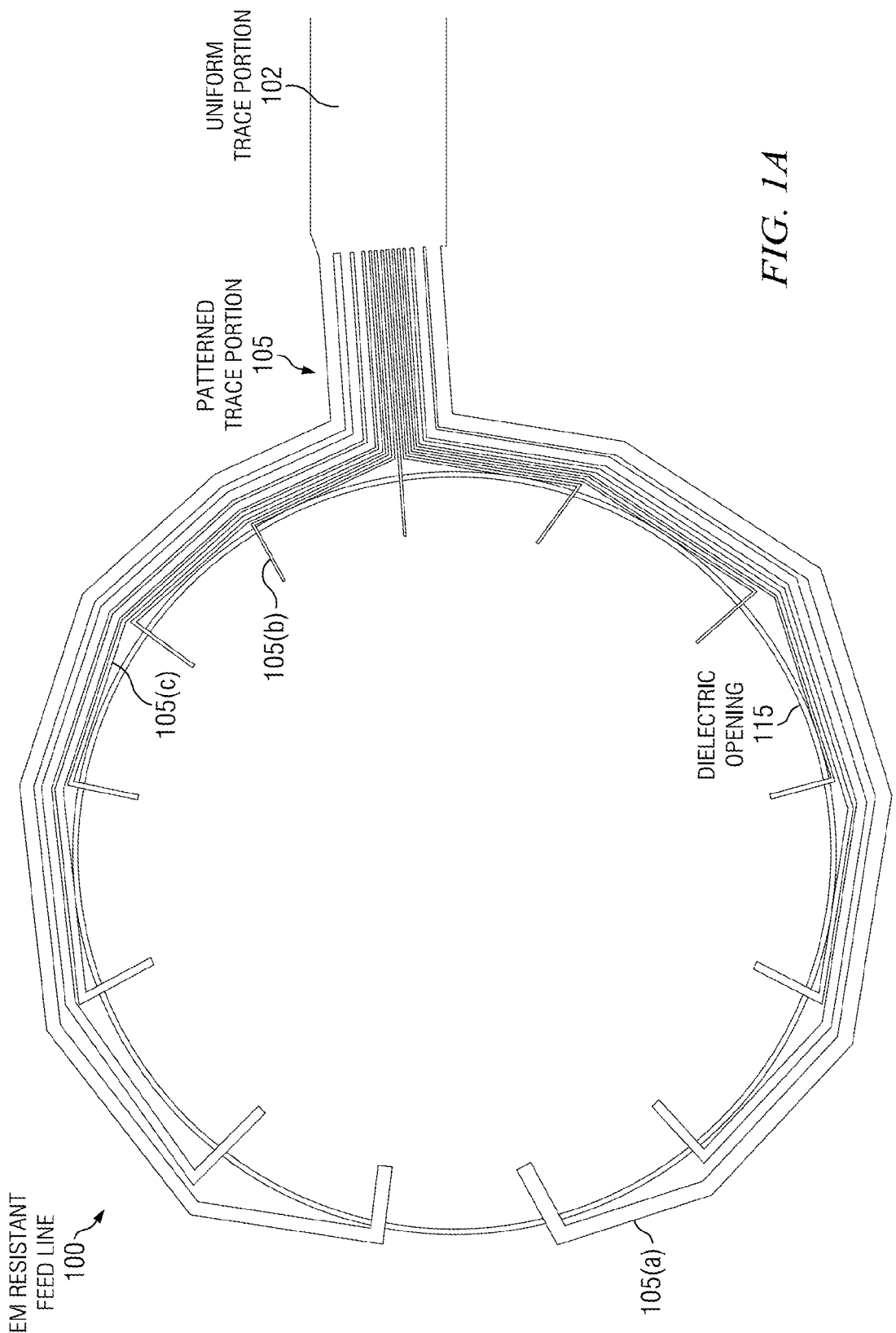
FIG. 1A shows a depiction of an example electromigration (EM) resistant feed line structure having at least three sub-traces that provide substantially equal sub-trace currents having a substantially equal distribution over the periphery of a dielectric opening under the bonding feature, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1A shows a depiction of an example EM resistant feed line structure 100 providing edge feed having at least three sub-traces that provide substantially equal sub-trace currents having a substantially equal distribution over the periphery of a dielectric opening 115 under a bonding feature, according to an example embodiment. Although one large dielectric opening 115 is shown in FIG. 1A, disclosed embodiments can instead include an array of smaller dielectric openings, or both, under a later formed bonding feature. The bonding features are generally described herein as being solder bumps. However, the bonding features can also comprise through substrate vias (TSVs), pillars (e.g., copper pillars), studs (e.g., gold studs), or an organic bonding material having a plurality of metal particles therein.

EM resistant feed line structure 100 comprises a uniform (i.e., conventional) trace portion 102 coupled to a patterned trace portion 105 comprising at least three sub-traces 105(a), 105(b), 105(c), etc. that are electrically in parallel and distributed to provide electrical contact along the periphery over the dielectric opening 115 shown that is under the later formed metal stack (not shown) including a bonding feature on a bond pad. The later formed metal stack will be over dielectric opening 115, which in one particular embodiment can comprise a solder ball/Ni under bump metallization (UMB)/Al bond pad.

Substantially equal sub-trace currents are provided by EM resistant feed line structure 100 because the respective plurality of feed line sub-traces 105(a), 105(b), 105(c), etc. are sized so that a number of squares associated with the respective paths provided by the sub-traces are all within a range of a mean number of squares for the plurality of sub-traces plus or minus twenty percent (±20%). It can be seen that sub-trace 105(a) which is the longest sub-trace shown in FIG. 1A is also the widest sub-trace, sub-trace 105(b) which is the shortest sub-trace shown is also the narrowest sub-trace, with sub-trace 105(c) being a sub-trace shown having an intermediate length and an intermediate line width. It is noted that although the sub-traces in patterned trace portion 105 are all shown having a constant line width along their respective path lengths, the line widths need not be constant to provide substantially equal sub-trace currents provided the resulting number of squares for the respective sub-traces are within the numerical range as described above.

FIG. 1A demonstrates that the edge feed embodiment takes up little extra metallization area as compared to a conventional single feed line arrangement for coupling to a bonding feature (e.g., solder bump). Since the edge feed embodiment shown in FIG. 1A provides improved current spreading in the overlying bonding feature (e.g. solder bump), this embodiment allows a reduced area for the bonding feature to be used to yield an overall smaller metal area requirement in the upper metal layers of the device for the same EM current performance, thus providing a cost savings for the IC device.

Applied to wafer chip scale packages (WSCPs), the uniform trace portion 102 and patterned trace portion 105 can both be formed from the redirect layer (RDL). In this embodiment patterned trace portion 105 couples to an RDL pad that is over a bond pad on the IC, while a UBM pad can be on the RDL pad, and a solder bump can be on the UBM pad. In this embodiment, the dielectric opening 115 can be an opening in the dielectric between the RDL and the UBM, such as an opening in a polyimide layer.

Figure 1B:
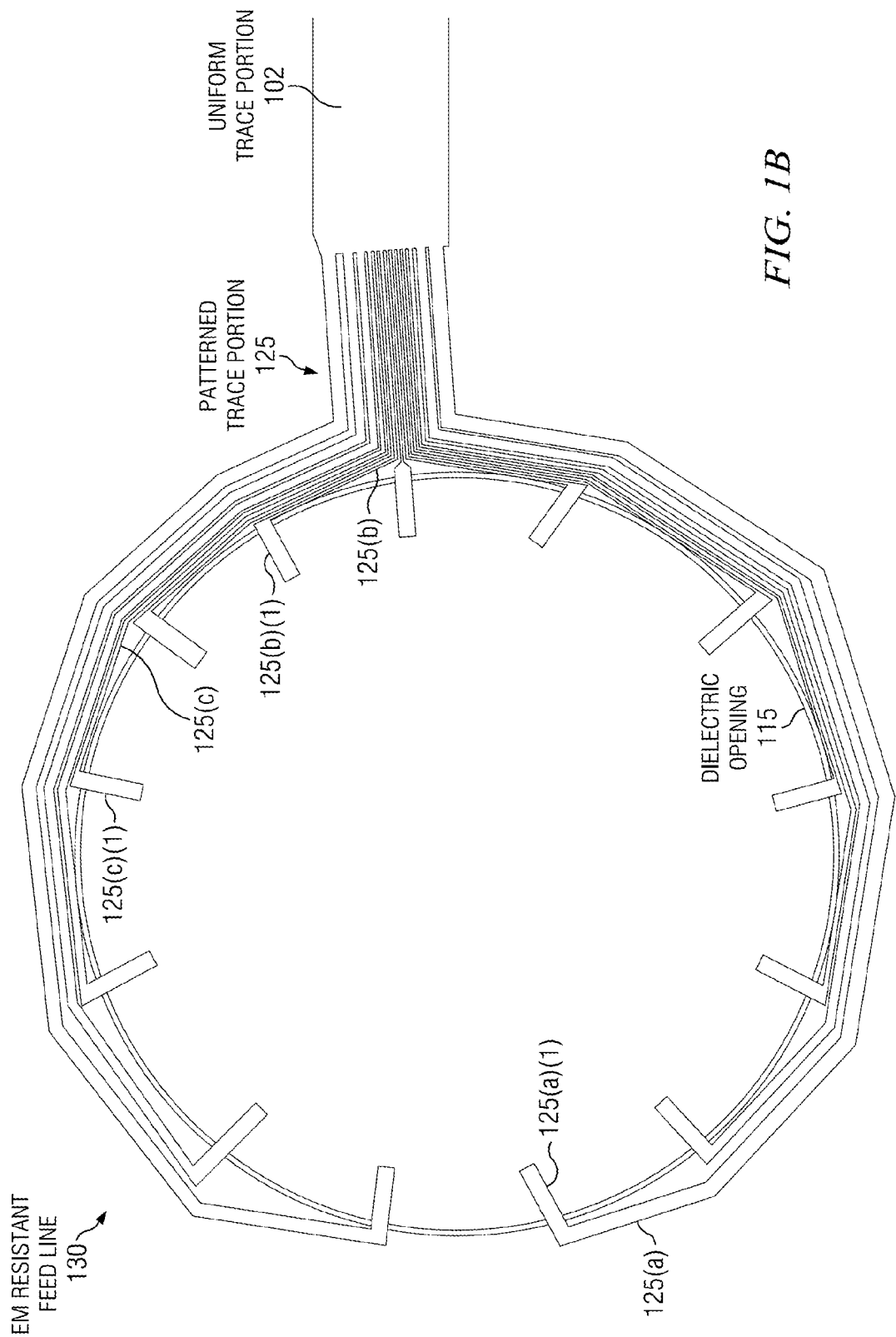
FIG. 1B shows a depiction of an example EM resistant feed line structure having at least three sub-traces that provide both substantially equal sub-trace currents and substantially equal sub-trace current densities, as well as substantially equal distribution over the periphery of a dielectric opening under the bonding feature, according to an example embodiment.

As described above, some disclosed embodiments can provide both substantially matched sub-currents and substantially matched current densities provided to the bonding feature conducted through each of the sub-traces. For example, FIG. 1B shows a depiction of an example EM resistant feed line structure 130 having at least three sub-traces 125(a), 125(b), 125(c) that provide both substantially equal sub-trace currents and substantially equal sub-trace current densities, while also providing a substantially equal physical distribution over the periphery of the dielectric opening 115 under the bonding feature, according to an example embodiment. As known in the art, the current density (J) going into the dielectric opening 115 under the bonding feature is found by dividing the current (I) at the sub-trace contact by the area (A) of the contact, and is given by J=I/A. It can be seen that narrow sub-traces such as sub-trace 125(b) is significantly widened at is distal end 125(b)(1) that extends into dielectric opening 115, as compared to longer sub-traces such as sub-trace 125(a) which shows no widening of its distal end 125(a)(1), so that width of the respective sub-traces at their distal ends that extend into dielectric opening 115 are the same width or are about the same width. Sub-trace 125(c) which has an intermediate line width shows moderate widening of its distal end 125(c)(1). Since currents in the respective sub-traces are matched to one another, and the area at their contacts are also the same, current density matching is provided.

Figure 1C:
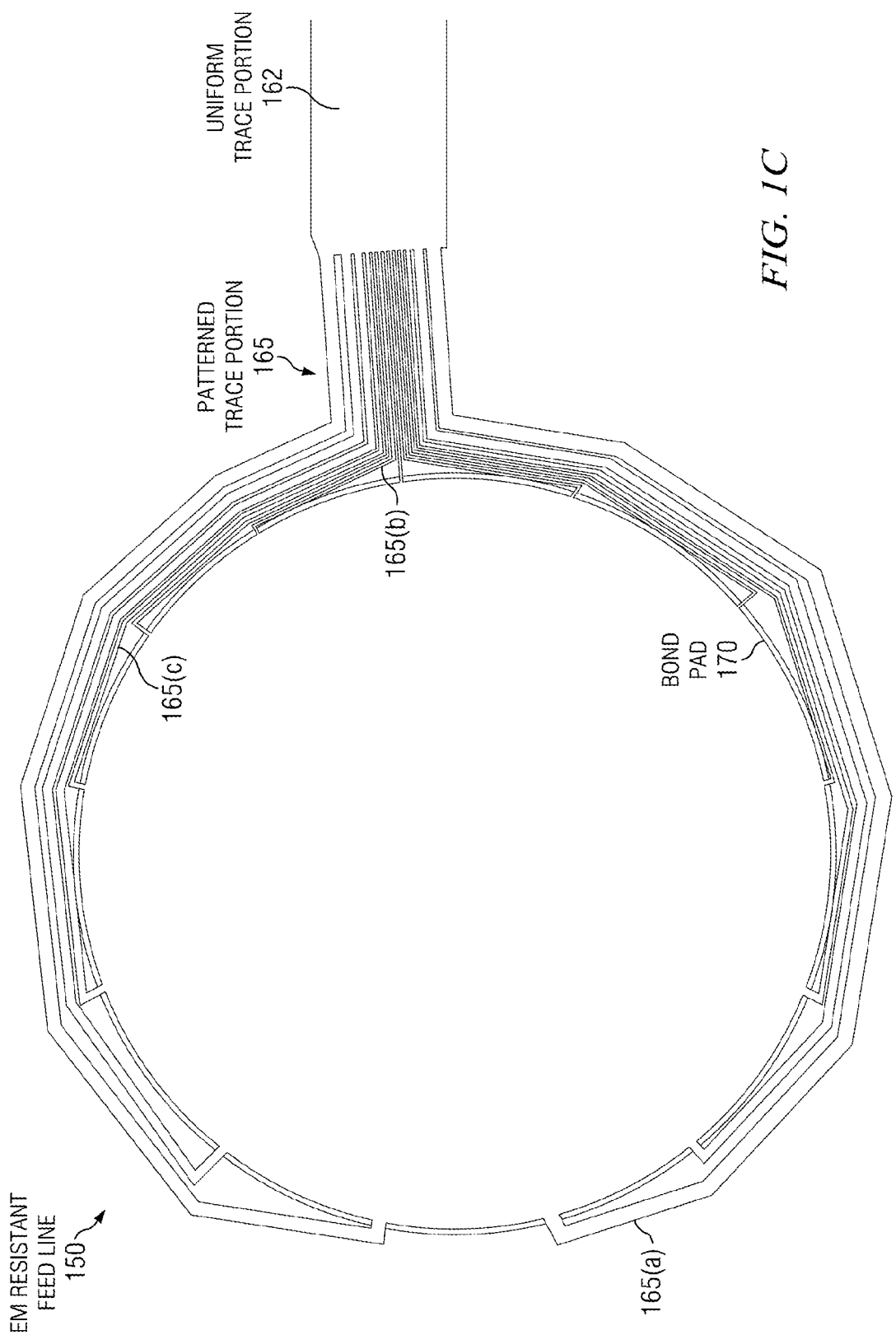
FIG. 1C shows a depiction of an example EM resistant feed line structure having a single metal layer that provides both the plurality of sub-traces and the bond pad, where the sub-traces provide substantially equal sub-trace currents to feed the bond pad along its periphery, according to an example embodiment.

FIG. 1C shows a depiction of an example EM resistant feed line structure 150 comprising a uniform trace portion 162 coupled to a patterned trace portion 165 having at least three sub-traces 165(a), 165(b), 165(c), etc. that provide substantially equal sub-trace currents that feed the bond pad 170 having a substantially equal distribution along a periphery of the bond pad, according to an example embodiment. In this embodiment the feed line structure 150 and the bond pad 170 are all formed from the same metal layer. This metal layer can be a metal interconnect layer, a top metal layer, or an RDL.

Figure 2A:
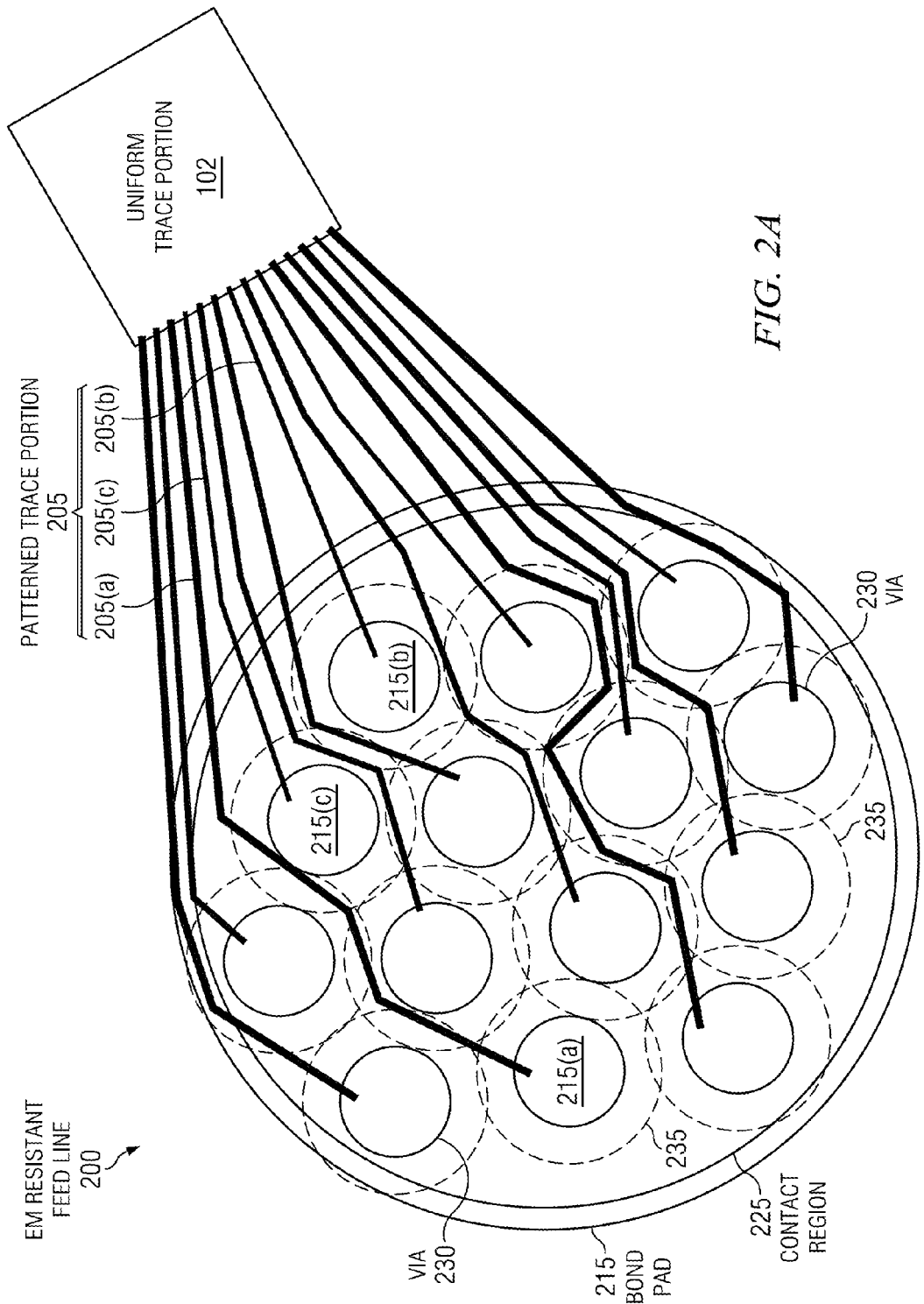
FIG. 2A shows a depiction of an example EM resistant feed line structure having at least three sub-traces that provide substantially equal sub-trace currents coupled in a contact region to a bond pad having vias thereon distributed across a full area of a bonding feature above the bond pad, according to an example embodiment.

FIG. 2A shows a depiction of an example EM resistant feed line structure 200 demonstrating the area feed embodiment having at least three sub-traces that provide substantially equal sub-trace currents coupled in a contact region 225 across the area of a bond pad, with a plurality of vias 230 formed in a dielectric layer on the bond pad 215, according to an example embodiment. EM resistant feed line structure 200 comprises a uniform trace portion 102 and a patterned trace portion 205 comprising a plurality of sub-traces 205(a), 205(b), 205(c), etc. The plurality of sub-traces 205(a), 205(b), 205(c), etc. are sized so that a number of squares associated with paths provided by each of the plurality of sub-traces are all within a range of a mean number of squares for the plurality of sub-traces plus or minus twenty percent.

In the contact region 225 the respective sub-traces 205(a), 205(b), 205(c) can contact the bond pad 215 using a single dielectric opening (such as dielectric opening 115 shown in FIG. 1A) or a plurality of vias formed in a dielectric layer between the sub-traces 205(a), 205(b), 205(c) and the bond pad 215. The bond pad 215 has an example circular via pattern including vias 230 formed from a dielectric layer thereon at locations that define the respective effective bond pad portions 215(a), 215(b), 215(c). The outer rings 235(a), 235(b), 235(c) shown as dashed rings represent current spreading beyond the bond pad portions 215(a), 215(b), 215(c) as the feed current traverses from the bond pad portions to an example 2 micron thick nickel UBM layer (not shown) that may be over the bond pad 215 in the contact region 225. As depicted in FIG. 2A, almost the entire area of an UBM layer over the contact region 225 spreads current for a bonding feature (e.g. solder bump) that can be positioned thereon, virtually guaranteeing uniform current distribution over the full cross sectional area of the bonding feature (e.g. solder bump).

In this embodiment, the top metal layer in which the bond pad 215 comprises (e.g., an aluminum layer) which can connect the UBM to the patterned trace portion 205 of the underlying metal (e.g., copper) sub-traces is effectively patterned. This patterning can be performed so that the openings over the bond pad 215 comprises array of vias, which can be shaped in a variety of shapes including, but not limited to, round or square depending upon the metal patterning requirements. The area of the vias can be based on the thickness of the bond pad metal and the UBM metal thereon, so that the area of the vias increase as the thickness of the bond pad metal and the UBM metal increase. For example, in embodiments including an UBM on the bond pad 215, where the vias 230 are round, the diameter of the vias 230 can be twice the UBM thickness plus twice the bond pad metal thickness plus or minus twenty percent. Thus, for a 1 micron thick bond pad 215 and a 2 micron thick UBM layer, the vias 230 can be six microns in diameter plus or minus twenty percent in diameter.

The spacing between adjacent vias 230 can also be based on the overlying metal thickness. For example, the via spacing can be so that the maximum distance to the next via is twice the UBM metal thickness plus or minus twenty percent. Thus, for a two micron thick UBM, the via-to-via distance can be four microns plus or minus twenty percent.

Each via 230 is thus fed by individual sub-traces 205(a), 205(b), 205(c) from uniform trace portion 102 in a manner such that the number of squares and thus the resistance of each sub-trace is substantially equal, but significantly higher than the sum of the resistance of the bonding feature stack (e.g. solder bump on UBM) plus the via resistance over the bond pad 215. Thus for a conventional dielectric (e.g., polyimide) via opening between the bond pad 215 and the UBM (e.g., solder bump opening) of 35 microns in diameter, and a 1 micron bond pad layer (e.g. aluminum) and 2 micron UBM (e.g., nickel), a conventional single dielectric opening over the bond pad can be replaced by 14 six micron circular vias 230 with 14 individual feed line sub-traces as shown in FIG. 2A. The vias may be shaped asymmetrically to allow easier routing of the sub-traces 205(a), 205(b), 205(c) should this be helpful. The overall (summed) widths of the sub-traces 205(a), 205(b), 205(c) to the effective bond pad portions 215(a), 215(b), 215(c) can be made equal to that of the uniform trace portion 102 to minimize the total resistance to the bonding feature (e.g., solder bump).

In another embodiment, a via pattern may be formed in the contact region 225 between the sub-traces and the bond pad 215, instead of vias over the bond pad 215 as shown in FIG.

2A, to yield a similar but enhanced current spreading feed line structure as compared to the feed line structure 200 shown in FIG. 2A. This embodiment has the advantage of additional current spreading as current traverses the thickness of bond pad 215 (e.g., 1 µm aluminum) before it reaches the UBM layer in embodiments including a UBM layer on the bond pad 215.

The area feed embodiment shown in FIG. 2A for bonding features on a UBM provides a uniform current distribution over substantially the entire bonding feature cross-section at the UBM to the bonding feature interface. This embodiment takes up very little if any extra metallization area as compared to a standard bump feed structure and has the advantage of a smaller bump structure which lowers the overall area for the bonding feature. Improved uniformity of the current distribution in the bonding feature and reduced area of the metal feed structure combine to yield an overall smaller metal area requirement in the upper metal layers of the IC device for the same current EM performance, thus leading to a cost savings for the IC device.

Figure 2B:
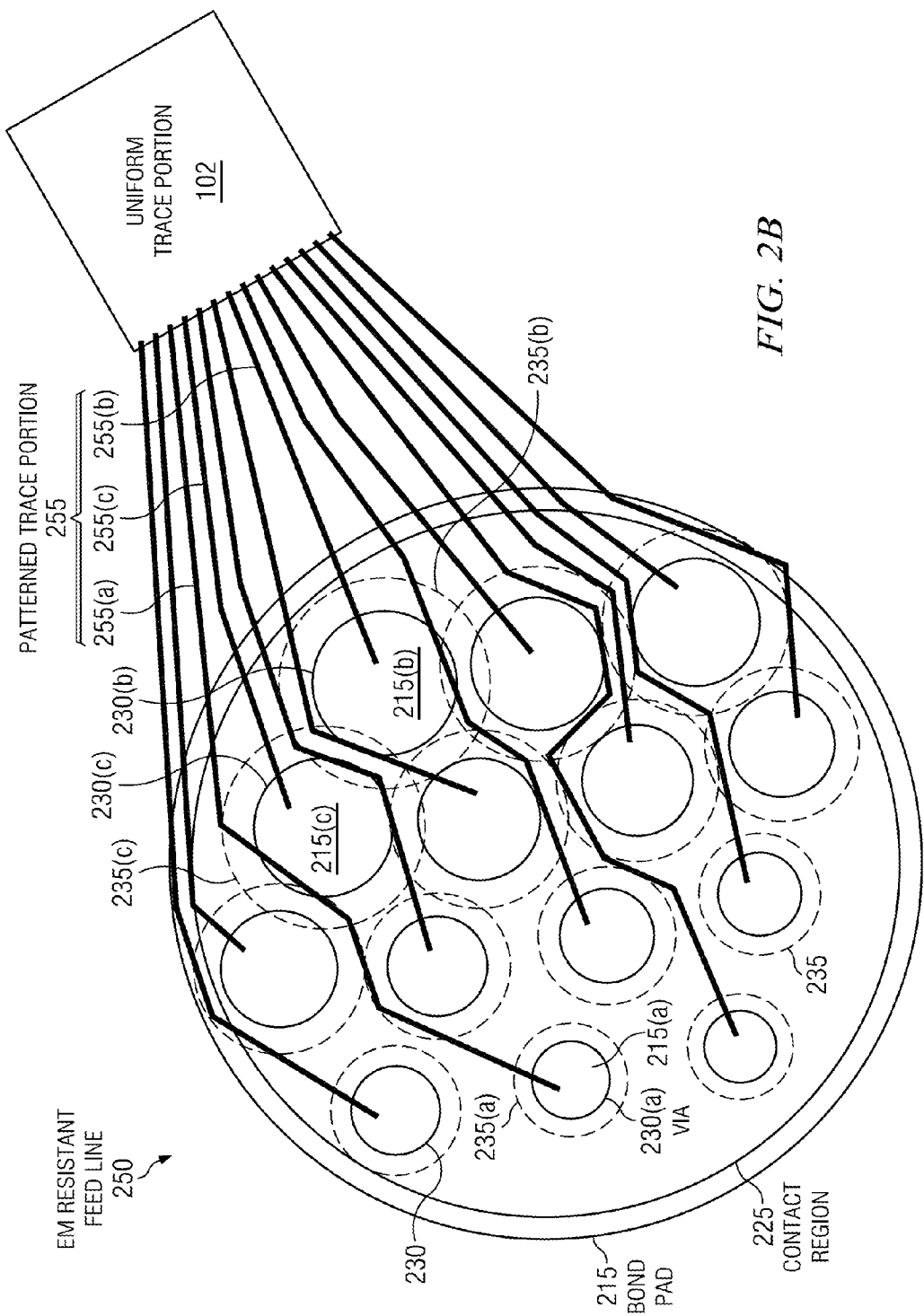
FIG. 2B shows a depiction of an example EM resistant feed line structure having at least three sub-traces that are coupled in a contact region to a bond pad having vias thereon distributed across a full area of a bonding feature above the bond pad, wherein the sub-trace currents have a range that is outside a mean number of squares for the sub-traces plus or minus twenty percent, and the vias are sized to provide substantially equal current densities to the bonding feature, according to an example embodiment.

FIG. 2B shows a depiction of an example EM resistant feed line structure 250 having at least three sub-traces 255(a), 255(b) and 255(c) coupled in the contact region 225 to a bond pad 215, with a plurality of vias 230(a), 230(b) and 230(c) formed in a dielectric layer on the bond pad 215 that are distributed across an area of the bond pad 215, wherein the sub-trace currents have a range that is outside a mean number of squares for the sub-traces plus or minus twenty percent, and the vias are sized to provide substantially equal current densities to a bonding feature above the bond pad, according to an example embodiment. In this embodiment, the vias 230(a), 230(b) and 230(c) are sized so that the shorter sub-traces such as 255(b) that result in higher currents are coupled to larger area via areas as compared to sub-traces that carry lower current such as sub-trace 255(a) that have smaller via areas. The outer rings are shown as 235(a), 235(b), 235(c) which have sizes that reflect the size of their corresponding vias 230(a), 230(b) and 230(c), depict current spreading beyond the bond pad portions 215(a), 215(b), 215(c) as the current traverses from the bond pad portions to a metal layer thereon (not shown) that is typically over the bond pad 215 in the contact region 225.

Disclosed embodiments can also be applied to IC designs where there are two or more independent feed lines (i.e., from different nodes on the IC) coupled to the same bonding feature (e.g., solder bump). Discretion may be used to determine whether the feeds should combined to maximize current uniformity, or be split based upon expected current loading on each incoming line. Thus, for a uniform split, the independent feed lines can be tied together before being split into sub-traces. For the cases where the expected current from each independent feed line is known by design, the number of contact vias feeding the bonding feature may be divided per input line to yield a uniform current distribution over the area of the bonding feature. Thus, if there are two independent feed lines with equal current on each line, then half of the vias can be assigned to one of the feed lines and half of the vias to the other feed line.

Figure 3:
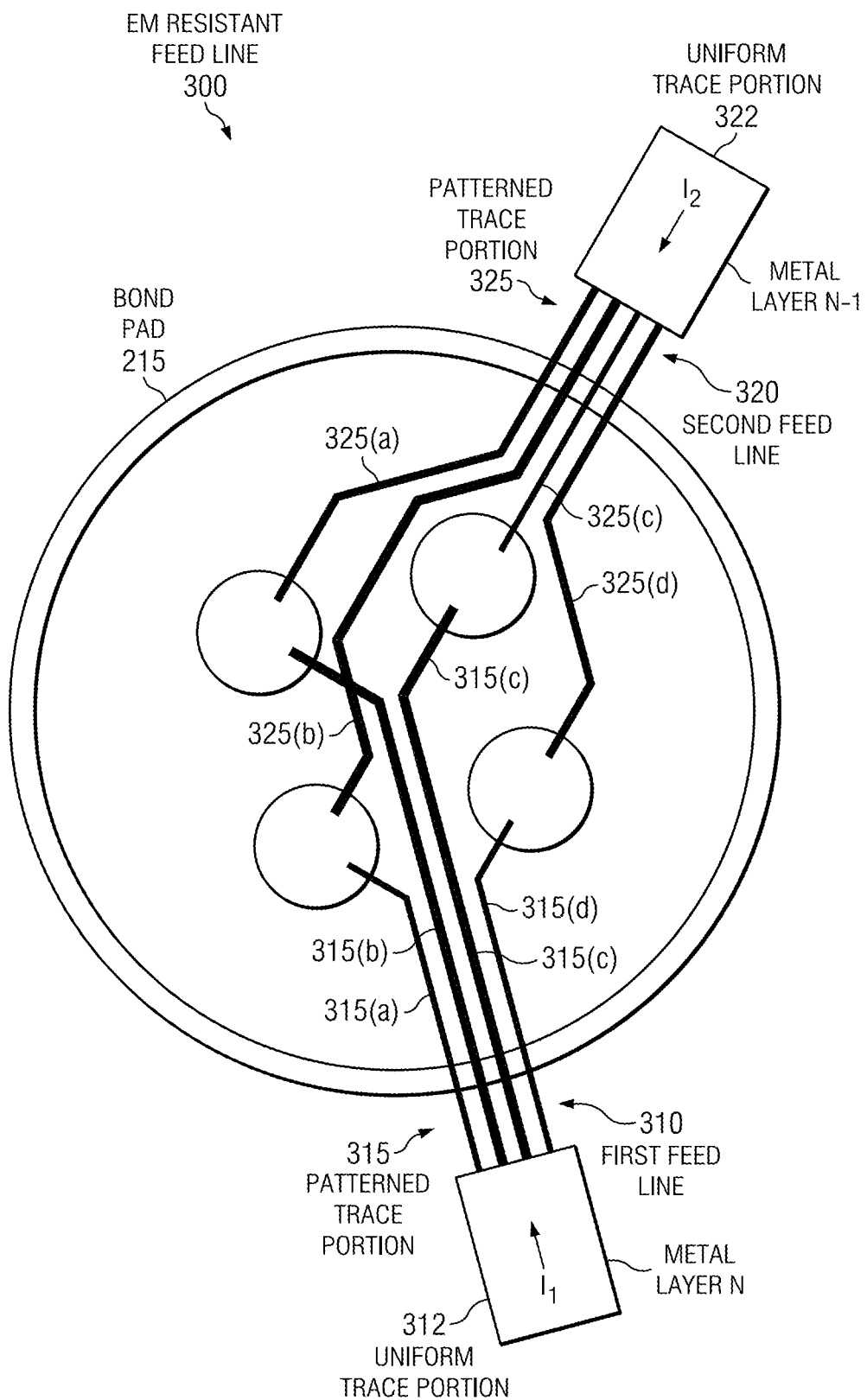
FIG. 3 shows a depiction of an example EM resistant feed line structure having a first independent feed line comprising a uniform trace portion and a second independent feed line comprising a uniform trace portion, both being coupled to the same bond pad, wherein the feed lines each comprise a patterned trace portion including four sub-traces sized to provide substantially equal sub-trace currents, according to an example embodiment.

FIG. 3 shows a depiction of an example EM resistant feed line structure 300 having a first independent feed line 310 comprising uniform trace portion 312 and a second independent feed line 320 comprising uniform trace portion 322 that are both coupled to a bond pad 215, wherein the feed lines 310 and 320 each comprise a patterned trace portion 315 and 325 that each comprise four sub-traces 315(a)-(d) and 325(a)-(d), that provide substantially equal sub-trace currents, according to an example embodiment. First feed line 310 and second feed line are shown formed from different metal interconnects. First feed line 310 is shown formed from metal layer N (e.g., seventh level metal), while second feed line 320 is shown formed from metal layer N−1 (e.g. sixth level metal). First feed line 310 is shown feeding a feed current of while second feed line 320 is shown feeding a current $I_2$. $I_1$ and $I_2$ are generally not equal currents.

Figure 4:
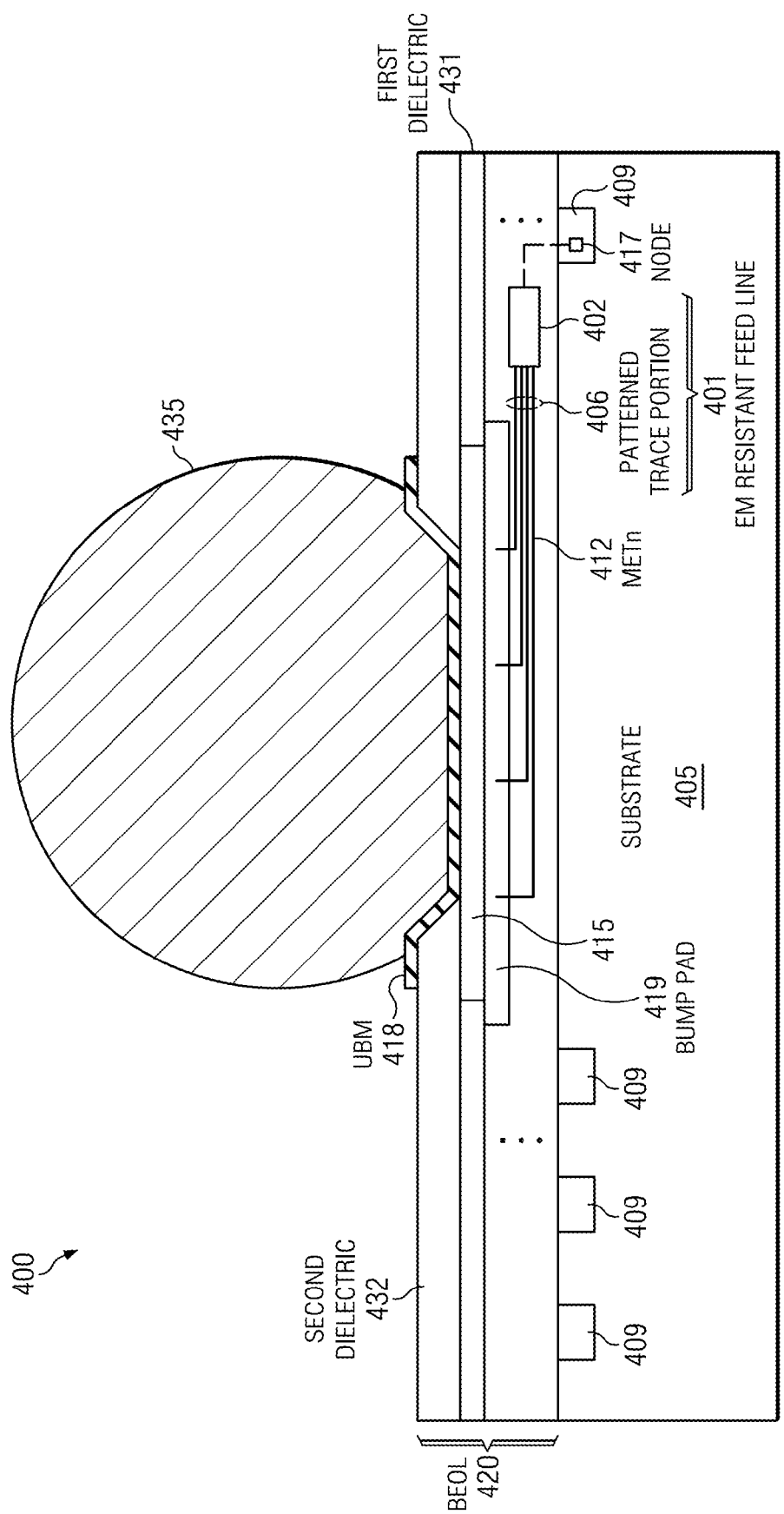
FIG. 4 shows an example IC device including a substrate having active circuitry, a back end of the line (BEOL) metallization stack including an interconnect metal layer including a disclosed EM resistant feed line structure comprising at least three sub-traces that provide substantially equal sub-trace currents coupled to a bond pad comprising a top metal layer, and a bonding feature on the bond pad, according to an example embodiment.

FIG. 4 shows an example IC device 400 including a back end of the line (BEOL) metallization stack 420 comprising a top interconnect metal layer shown as METn 412 that includes a disclosed EM resistant feed line 401 comprising a uniform trace portion 402 and a patterned trace portion 406 comprising a plurality of sub-traces that couple to a bump pad 419 comprising METn (e.g., a copper bump pad), such as by a dielectric opening analogous to the dielectric opening 115 shown in FIG. 1A or a plurality of vias (not shown). BEOL stack 420 also includes first dielectric layer 431 and second dielectric layer 432. IC device 400 includes a substrate 405 having active circuitry 409, where a node 417 in the active circuitry is shown coupled to uniform trace portion 402 by a connection through the BEOL 420.

A bond pad 415 formed from a top metal layer (e.g., aluminum) is on the bump pad 419, a UBM pad that provides a current spreading layer is on bond pad 415, and a bonding feature shown as a solder bump 435 is on the UBM pad 418. Although METn 412 is shown in FIG. 4 providing the EM resistant feed lines, any of the metal interconnect layers on IC 400 may generally be used to provide EM resistant feed lines, such as underlying metal interconnect layers. It is noted that for certain bonding features, the UBM pad 418 shown may not be needed. For example, when the bonding feature comprises a cooper pillar, the copper pillar can be formed directly on a copper bond pad.

Figure 5:
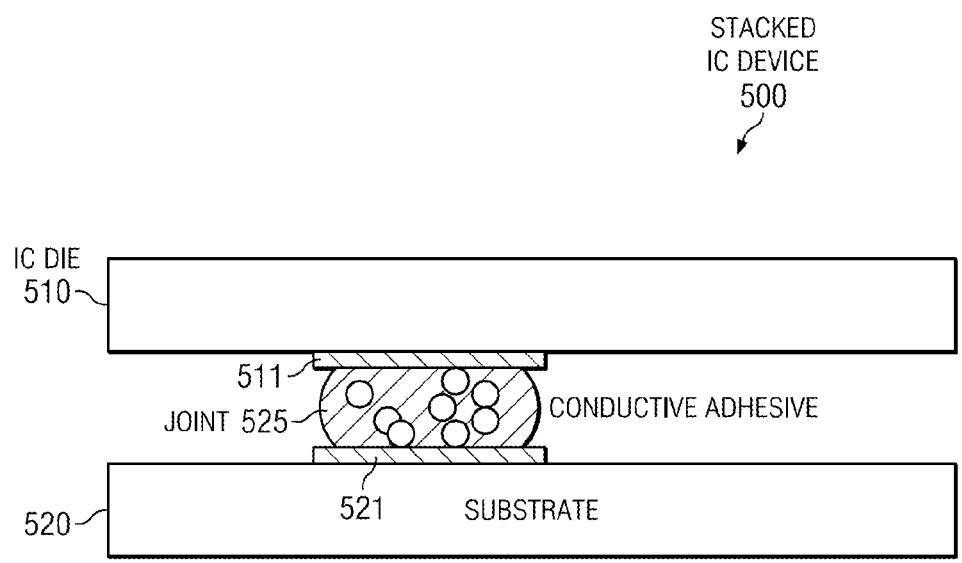
FIG. 5 shows a stacked IC device comprising an IC die having a disclosed EM resistant feed line structure comprising at least three sub-traces that provide substantially equal sub-trace currents bonded to a substrate by a joint that comprises a metal/organic bonding material, according to an example embodiment.

FIG. 5 shows a stacked IC device 500 comprising an IC die 510 having a disclosed EM resistant feed line structure in a flip chip arrangement coupled to a pad 511 bonded to a substrate 520 having a pad 521 by a joint 525 that comprises a metal/organic bonding material, according to an example embodiment. Disclosed embodiments may be particularly helpful for bonding materials with low EM resistance such as the metal/organic bonding material shown by current spreading provided across substantially the entire cross sectional area of the joint 525 provided by disclosed feed line structures.

Disclosed embodiments can generally be applied to any feed line structure coupled to a bonding feature. WCSPs including a ball is only one example. Other feed structures that can benefit from disclosed embodiments include TSV to RDL to remote pad arrangements.

Simulations were performed to compare the EM performance using the mean time to failure (MTTF) parameter obtained from Black's equation for the EM resistant feed line structure 100 shown in FIG. 1A (edge feed), the EM resistant feed line structure 200 shown in FIG. 2A (area feed), both with fourteen feed line sub-traces sized to provide substantially equal sub-trace currents coupled to a bond pad, with a 2 micron Ni UMB on the bond pad and a solder bump on the UBM, vs. two different reference structures. The first reference structure comprised fourteen feed line sub-traces equivalent to feed line structure 200 other than having the same uniform sub-trace line width throughout their lengths, and the second reference structure comprised a conventional single feed line arrangement with the same layer stack on the bond pad. Black's Equation (shown below) is a mathematical model for the MTTF of a semiconductor circuit due to EM:

$$MTTF = A\omega j^{-n} e^{\left(\frac{Q}{kT}\right)}$$

where A is a constant, j is the current density, n is a model parameter, Q is the activation energy in eV (electron volts), k is Boltzmann constant, T is the absolute temperature in K, and w is the width of the metal line/wire.

Based on simulations performed, the first reference structure having fourteen feed line sub-traces all having the same uniform line width over their respective lengths provided an improvement in solder lifetime by about 20 to 40% as compared to the conventional single feed line arrangement. In contrast, feed line structure 100 shown in FIG. 1A was found to provide an improvement in solder lifetime of 200 to 300%. The feed line structure 200 shown in FIG. 2A was found to provide an improvement in solder lifetime of more than an order of magnitude, i.e. >1,000%.

The magnitude of the MTTF performance impact found to be obtained by disclosed embodiments including sub-trace sizing for matching sub-trace currents evidenced an unexpected result that demonstrates criticality based on the magnitude of the improvement. Specifically, the 200 to 300% improvement in solder lifetime for the edge feed embodiment and >1,000% improvement in solder lifetime for the area feed embodiment both represent a marked improvement over the results achieved from the conventional feed line structure as well as the first reference structure, as to be properly considered a difference in kind, rather than a difference of degree.

The active circuitry formed on the wafer semiconductor substrate comprises circuit elements that may generally include transistors, diodes, capacitors, and resistors, as well as signal lines and other electrical conductors that interconnect the various circuit elements and are configured to provide an IC circuit function. As used herein "provide an IC circuit function" refers to circuit functions from ICs, that for example may include an application specific integrated circuit (ASIC), a digital signal processor, a radio frequency chip, a memory, a microcontroller and a system-on-a-chip or a combination thereof. Disclosed embodiments can be integrated into a variety of process flows to form a variety of devices and related products. The semiconductor substrates may include various elements therein and/or layers thereon. These can include barrier layers, other dielectric layers, device structures, active elements and passive elements, including source regions, drain regions, bit lines, bases, emitters, collectors, conductive lines, conductive vias, etc. Moreover, disclosed embodiments can be used in a variety of semiconductor device fabrication processes including bipolar, CMOS, BiCMOS and MEMS processes.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:
1. An integrated circuit (IC) device, comprising:
a substrate having a top surface including active circuitry configured to provide an IC circuit function;
a back end of the line (BEOL) metallization stack including an interconnect metal layer that includes at least one trace that couples to a bond pad, and
a bonding feature on said bond pad;
wherein said trace includes a uniform trace portion and patterned trace portion that extends to said bond pad, wherein said patterned trace portion includes at least three sub-traces that are electrically in parallel to one another.

2. The IC device of claim 1, wherein said subtraces have different width and different lengths but each sub-trace has substantially equal number of squares to produce equal sub-trace currents, substantially defined as a number of squares for each of said sub-traces are within a range of a mean number of squares for said sub-traces plus or minus twenty percent.

3. The IC device of claim 1, wherein said subtraces have different width and different lengths but each sub-trace has a number of squares to produce equal sub-trace currents, wherein a current density provided to said bonding feature conducted through each of said sub-traces are within a range of a mean current density provided to said bonding feature plus or minus twenty percent.

4. The IC device of claim 1, wherein said sub-traces contact said bond pad along its periphery, and wherein said sub-traces have substantially equal separation from one another along said periphery.

5. The IC device of claim 1, wherein said sub-traces include at least 10 sub-traces.

6. The IC device of claim 1, wherein said BEOL metallization stack includes a top metal layer and said interconnect metal layer is beneath said top metal layer, and wherein said bond pad comprises said top metal layer.

7. The IC device of claim 1, wherein said bonding feature comprises a solder bump, a through substrate via (TSV), a pillar, a stud, or an organic bonding material having a plurality of metal particles therein.

8. The IC device of claim 1, further comprising a plurality of vias in a dielectric layer between respective ones of said sub-traces and said bonding feature.

9. The IC device of claim 1, further comprising a current spreading layer between said bond pad and said bonding feature and a dielectric layer between said bond pad and said current spreading layer, wherein said dielectric layer includes a plurality of vias that provide separate contacts between said bond pad and said current spreading layer.

10. The IC device of claim 9, wherein said sub-traces are sized so that a number of squares associated with paths provided by at least one of said sub-traces is outside a range of a mean number of squares for said sub-traces plus or minus twenty percent, and wherein respective ones of said vias are sized to provide a current density to said bonding feature conducted through each of said sub-traces which is within a range of a mean current density provided to said bonding feature plus or minus twenty percent.

11. The IC device of claim 1, wherein said at least one trace comprises a plurality of independent traces including a first trace including a first patterned trace portion dividing into at least three sub-traces, and a second trace including a second patterned trace portion dividing into at least three second sub-traces.

12. The IC device of claim 1, wherein said bonding feature comprises a solder bump.

13. An integrated circuit (IC) device, comprising:
a substrate having a top surface including active circuitry configured to provide an IC circuit function;
a back end of the line (BEOL) metallization stack including a top metal layer and an interconnect metal layer beneath said top metal layer, wherein said interconnect metal layer includes at least one trace that that couples to a bond pad comprising said top metal layer;

an under bump metallization (UBM) layer formed on said bond pad, and a solder bump formed on said UBM layer;

wherein said trace includes a patterned trace portion that extends to said bond pad, wherein said patterned trace portion divides into at least three sub-traces that are electrically in parallel to one another.

14. A method of forming an integrated circuit (IC) device, comprising:

providing a substrate having a top surface including active circuitry;

forming a back end of the line (BEOL) metallization stack including an interconnect metal layer that includes at least one trace that includes a patterned trace portion comprising at least three sub-traces that are electrically in parallel to one another;

forming a bond pad that is coupled to said at least three sub-traces, and forming a bonding feature on said bond pad, wherein said patterned trace portion includes at least three sub-traces that are electrically in parallel to one another.

15. The method of claim 14, wherein said forming said BEOL metallization stack includes forming a top metal layer, wherein said interconnect metal layer is beneath said top metal layer, and wherein said bond pad comprises said top metal layer.

16. The method of claim 14, wherein said sub-traces contact said bond pad along its periphery, and wherein said sub-traces have substantially equal separation to neighboring ones of said sub-traces along said periphery.

17. The method of claim 14, further comprising forming a current spreading layer between said bond pad and said bonding feature, forming a dielectric layer between said bond pad and said current spreading layer, and forming a plurality of vias in said dielectric layer that each provide separate contacts between said bond pad and said current spreading layer.

18. The method of claim 14, wherein said bonding feature comprises a solder bump.

* * * * *